(12) United States Patent
Moon

(10) Patent No.: US 7,351,621 B2
(45) Date of Patent: Apr. 1, 2008

(54) ARRAY SUBSTRATE FOR A LIQUID CRYSTAL DISPLAY AND METHOD FOR FABRICATING THEREOF

(75) Inventor: Kyo-Ho Moon, Daegu (KR)

(73) Assignee: LG.Philips LCD Co., Ltd., Seoul (KR)

( * ) Notice: Subject to any disclaimer, the term of this patent is extended or adjusted under 35 U.S.C. 154(b) by 28 days.

(21) Appl. No.: 10/862,567

(22) Filed: Jun. 8, 2004

(65) Prior Publication Data

US 2004/0227865 A1    Nov. 18, 2004

Related U.S. Application Data

(62) Division of application No. 09/984,257, filed on Oct. 29, 2001, now Pat. No. 6,788,357.

(30) Foreign Application Priority Data

Oct. 31, 2000 (KR) ............... 2000-64379

(51) Int. Cl.
H01L 21/84 (2006.01)
(52) U.S. Cl. ...................... 438/155; 438/158
(58) Field of Classification Search ........... 438/30, 438/149, 151, 155, 158, 157, 238
See application file for complete search history.

(56) References Cited

U.S. PATENT DOCUMENTS 5,028,122 A * 7/1991 Hamada et al. ............. 349/38
5,032,536 A * 7/1991 Oritsuki et al. ............. 438/30
5,057,885 A * 10/1991 Matsumoto et al. ......... 257/326
5,068,699 A * 11/1991 Chang ......................... 257/410
5,079,606 A * 1/1992 Yamamura et al. ......... 257/365
5,311,040 A * 5/1994 Hiramatsu et al. ........... 257/57

(Continued)

FOREIGN PATENT DOCUMENTS

KR    1997-00616712    4/1997

(Continued)

OTHER PUBLICATIONS

Office Action issued by the Korean Patent Office on Sep. 25, 2006.

*Primary Examiner*—M. Wilczewski
(74) *Attorney, Agent, or Firm*—McKenna, Long & Aldridge LLP

(57) ABSTRACT

An array substrate for a liquid crystal display device includes a substrate, a plurality of thin film transistors formed on the substrate, each thin film transistor includes a gate electrode, a first gate insulation layer, a second gate insulation layer, an active layer, an ohmic contact layer, a source electrode and a drain electrode, a plurality of gate lines, a plurality of data lines disposed orthogonal to the plurality of gate lines, a plurality of pixel electrodes disposed at pixel regions defined by intersections of the plurality of gate lines and the plurality of data lines, each pixel electrode electrically contacting each drain electrode of the plurality of thin film transistors, and a plurality of storage capacitors each including a portion of each gate line as a first capacitor electrode, the first gate insulation layer as a dielectric layer, and a capacitor electrode electrically communicating with each pixel electrode and functioning as a second capacitor electrode with a portion of each pixel electrode.

7 Claims, 12 Drawing Sheets

U.S. PATENT DOCUMENTS

| | | | |
|---|---|---|---|
| 5,334,544 A * | 8/1994 | Matsuoka et al. | 438/158 |
| 5,409,581 A * | 4/1995 | Harrison et al. | 205/334 |
| 5,610,082 A * | 3/1997 | Oh | 438/160 |
| 5,703,382 A * | 12/1997 | Hack et al. | 257/72 |
| 5,737,049 A * | 4/1998 | Shin et al. | 349/122 |
| 5,771,083 A * | 6/1998 | Fujihara et al. | 349/147 |
| 5,872,021 A * | 2/1999 | Matsumoto et al. | 438/30 |
| 5,888,855 A * | 3/1999 | Nagahisa et al. | 438/158 |
| 5,923,963 A * | 7/1999 | Yamanaka | 438/157 |
| 5,953,583 A * | 9/1999 | Ban et al. | 438/30 |
| 5,966,190 A * | 10/1999 | Dohjo et al. | 349/39 |
| 5,966,589 A * | 10/1999 | Watanabe et al. | 438/30 |
| 6,010,923 A * | 1/2000 | Jinno | 438/158 |
| 6,020,224 A * | 2/2000 | Shimogaichi et al. | 438/158 |
| 6,078,366 A | 6/2000 | Dohjo et al. | |
| 6,356,318 B1 | 3/2002 | Kawahata | |
| 7,132,687 B2 * | 11/2006 | Kawasaki et al. | 257/59 |
| 2002/0168803 A1* | 11/2002 | Kim | 438/149 |

FOREIGN PATENT DOCUMENTS

KR    2000-0039802    7/2000

* cited by examiner

ARRAY SUBSTRATE FOR A LIQUID CRYSTAL DISPLAY AND METHOD FOR FABRICATING THEREOF

This is a divisional of Application No. 09/984,257, filed on Oct. 29, 2001 now U.S. Pat. No. 6,788,357.

This application claims the benefit of Korean Patent Application No. 2000-64379, filed on Oct. 31,2000 in Korea, which is hereby incorporated by reference.

BACKGROUND OF THE INVENTION

1. Field of the Invention

The present invention relates to a liquid crystal display device, and more particularly, to an array substrate for a liquid crystal display device.

2. Description of Related Art

Generally, liquid crystal display (LCD) devices make use of optical anisotropy and polarization properties of liquid crystal molecules to control alignment orientation. The alignment direction of the liquid crystal molecules can be controlled by application of an electric field. Accordingly, when the electric field is applied to liquid crystal molecules, the alignment of the liquid crystal molecules changes. Since refraction of incident light is determined by the alignment of the liquid crystal molecules, display of image data can be controlled by changing the applied electric field.

Of the different types of known LCDs, active matrix LCDs (AM-LCDs), which have thin film transistors and pixel electrodes arranged in a matrix form, are of particular interest because of their high resolution and superiority in displaying moving images. Because of their light weight, thin profile, and low power consumption characteristics, LCD devices have wide application in office automation (OA) equipment and video units. A typical liquid crystal display (LCD) panel may include an upper substrate, a lower substrate and a liquid crystal layer interposed therebetween. The upper substrate, commonly referred to as a color filter substrate, may include a common electrode and color filters. The lower substrate, commonly referred to as an array substrate, may include switching elements, such as thin film transistors (TFTs), and pixel electrodes.

LCD device operation is based on the principle that the alignment direction of the liquid crystal molecules is dependent upon an electric field applied between the common electrode and the pixel electrode. Moreover, because the liquid crystal molecules have spontaneous polarization characteristics, the liquid crystal layer is considered an optical anisotropy material. As a result of the spontaneous polarization characteristics, the liquid crystal molecules possess dipole moments when a voltage is applied to the liquid crystal layer between the common electrode and pixel electrode. Thus, the alignment direction of the liquid crystal molecules is controlled by the application of an electric field to the liquid crystal layer. When the alignment direction of the liquid crystal molecules is properly adjusted, incident light is refracted along the alignment direction to display image data. The liquid crystal molecules function as an optical modulation element having variable optical characteristics that depend upon polarity of the applied voltage.

FIG. 1 shows a conventional LCD device. The LCD device 11 includes an upper substrate 5 and a lower substrate 22 with a liquid crystal layer 14 interposed therebetween. The upper substrate 5 and the lower substrate 22 are commonly referred to as a color filter substrate and an array substrate, respectively. Within the upper substrate 5 and upon the surface opposing the lower substrate 22, a black matrix 6 and a color filter layer 7 are formed in the shape of an array matrix and include a plurality of red (R), green (G), and blue (B) color filters so that each color filter is surrounded by corresponding portions of the black matrix 6. Additionally, a common electrode 18 is formed on the upper substrate 5 to cover the color filter layer 7 and the black matrix 6. In the lower substrate 22 and upon the surface opposing the upper substrate 5, a thin film transistor (TFT) "T," is formed in the shape of an array matrix corresponding to the color filter layer 7. A plurality of crossing gate lines 13 and data lines 15 are positioned such that each TFT "T" is located adjacent to each crossover point of the gate lines 13 and the data lines 15. Furthermore, a plurality of pixel electrodes 17 are formed on a pixel region "P" defined by the gate lines 13 and the data lines 15 of the lower substrate 22. The pixel electrode 17 includes a transparent conductive material having good transmissivity such as indium-tin-oxide (ITO) or indium-zinc-oxide (IZO), for example.

According to the LCD device 11 of FIG. 1, a scanning signal is applied to a gate electrode of the TFT "T" through the gate line 13, while a data signal is applied to a source electrode of the TFT "T" through the data line 15. As a result, the liquid crystal molecules of the liquid crystal layer 14 are aligned and arranged by operation of the TFT "T," and incident light passing through the liquid crystal layer 14 is controlled to display an image.

FIG. 2A is a plan view showing a pixel of a conventional array substrate for use in a liquid crystal display device. In FIG. 2, an array substrate 22 includes a pixel region "P" having a corresponding thin film transistor (TFT) "T," a pixel electrode 17 and a storage capacitor "C." Gate lines 13 are arranged in a transverse direction and data lines 15 are arranged in a longitudinal direction such that each pair of the gate lines 13 and the data lines 15 define a pixel region "P." The TFT "T" includes a gate electrode 26, a source electrode 28, a drain electrode 30 and an active layer 33. The gate electrode 26 of the TFT "T" extends from the gate line 13, while the source electrode 28 of the TFT "T" extends from the data line 15. The drain electrode 30 is spaced apart from the source electrode 28 and the active layer 55 is disposed over the gate electrode 24 between the source electrode 28 and the drain electrode 30. The source electrode 28 and the drain electrode 30 overlap opposite ends of the gate electrode 26. A portion of the pixel electrode 17 overlaps a portion of the drain electrode 30 and electrically contacts the drain electrode 30 through a drain contact hole 41. Furthermore, the storage capacitor "C" is a storage-on-gate type capacitor, and thus comprises a capacitor electrode 16 electrically communicating with a pixel electrode 17 through a capacitor contact hole 43, a portion of the gate line 13, and an insulator functioning as a dielectric layer (not show in FIG. 2). Namely, the storage capacitor "C" has M/I/M (metal/insulator/metal) structure. At this point, the position and configuration of the storage capacitor "C" can be various.

In the above-described structure, a parasitic capacitor is formed between the gate electrode 26 and the drain electrode 28 of the TFT "T." The parasitic capacitance influences and deteriorates function of the liquid crystal layer since the parasitic capacitance is a direct-current component of the voltage. Furthermore, the gate electrode 26 and the drain electrode 28 of the TFT "T" can become short-circuited if the gate insulation layer disposed on the gate electrode 26 has defects, such as pinholes or cracks. Accordingly, the gate insulation layer in a conventional array substrate, which is used as a dielectric layer in the storage capacitor "C," is formed of a relatively large thickness over the gate electrodes and gate lines.

Thin film transistors (TFTs) can be divided into two generally different categories based upon the relative disposition of their gate electrodes—staggered types and coplanar types. The staggered type TFT includes an inverted staggered type which is generally used for LCD devices due to their simple structure and superior efficiency. Within the inverted staggered type TFT there includes a back channel etched type (EB) and an etch stopper type (ES). A manufacturing method of the back channel etched type TFT will be explained hereinafter.

FIGS. 3A to 3J are plan views and cross-sectional views each taken along the line III-III of corresponding plan view and illustrates conventional manufacturing processes of an array substrate of FIG. 2B.

Referring to FIG. 3A, a substrate 22 is cleaned of organic materials and any foreign substances to promote adhesion with a first metal layer that is subsequently deposited on the substrate 22 by a sputtering process, for example. Here, the first metal layer is aluminum or aluminum alloy, such as aluminum neodymium (AlNd), for example. Then, the first metal layer is subsequently patterned using a first mask to form the gate lines 13 in a transverse direction and a gate electrode 26 that extends from the gate line 13. In the conventional array substrate, aluminum is conventionally used as a metal for the first metal layer because of its low resistance and reduced RC delay. However, pure aluminum is chemically weak when exposed to acidic fabrication processing, thereby resulting in formation of hillocks during high temperature fabrication processing. Accordingly, aluminum alloys and double-layered structure are used for the first metal layer. When employing the double-layered structure for the gate electrode 26 and gate line 13, the aluminum (Al) layer or the aluminum alloy layer is stacked with a molybdenum (Mo) layer or a chrome (Cr) layer that has high corrosion resistance and durability.

In FIG. 3A, the gate insulation layer 33 is formed on a surface of the substrate 22 to cover the patterned first metal layer. Then, a pure amorphous silicon (a-Si:H) layer 53 and a doped amorphous silicon (n+ a-Si:H) layer 54 are sequentually formed upon the gate insulation layer 33. The gate insulation layer is an inorganic material, such as silicon nitride (SiN$_x$) or silicon oxide (SiO$_x$), or an organic material, such as benzocyclobutene (BCB) or acryl-based resin, for example.

FIG. 3B shows a second mask fabrication process in which the pure amorphous silicon layer and doped amorphous silicon layer are patterned. A photo resist is formed on the doped amorphous silicon layer and then exposed to light using the second mask. Thereafter, the photo resist is developed to form a patterned photo resist 35 over the gate electrode 26 and to expose the doped amorphous silicon layer.

In FIGS. 3C and 3D, an exposed portion of the doped amorphous silicon layer 54 is removed, and a portion of the pure amorphous silicon layer 53 is also removed to form an active layer 55 and an ohmic contact layer 56. Accordingly, a semiconductor layer 58 including the active layer 55 and ohmic contact layer 56 are formed on the gate insulation layer 33 disposed over the gate electrode 26. As a result of this fabrication process, the gate insulation layer 33 is exposed except for a portion disposed over the gate electrode 26.

In FIGS. 3E and 3F, a second metal layer is formed upon the ohmic contact layer 56 and upon the gate insulation layer 33 by depositing a metallic material, such as molybdenum (Mo), chrome (Cr), tungsten (W), aluminum (Al), aluminum alloy or an alloy thereof. The second metal layer is subsequently patterned using a third mask to form a source electrode 28, a drain electrode 30, a data line 15, and a capacitor electrode 16. The data line 15 is arranged perpendicular to the gate line 13 and defines a pixel region "P" with a data line 13. The source electrode 28 extends from the data line 15 and overlaps an end portion of the gate electrode 26. The drain electrode 30 is space apart from the source electrode 28 and overlaps an opposite end portion of the gate electrode 26. Thus, a thin film transistor (TFT) "T" is formed. Moreover, the capacitor electrode 16 is disposed over a portion 13a of the gate line 13. Therefore, a storage capacitor "C" comprises the portion 13a of the gate line 13 as a first capacitor electrode, a portion of gate insulation layer 33 as a dielectric layer, and the capacitor electrode 16 as a second capacitor electrode. Since the capacitor electrode 16 is formed over the portion 13a of the gate line 13, the structure is commonly referred to as a storage-on-gate structure. If the second metal layer is formed of aluminum in the above-described structure, molybdenum (Mo) or chrome (Cr) is disposed on the second metal layer in order to form a double-layered structure.

In FIGS. 3E and 3F, a portion of the ohmic contact layer 56 disposed upon the active layer 55 is etched using the source electrode 28 and drain electrode 30 as masks, thereby forming a channel region in the active layer 55 between the source electrode 28 and the drain electrode 30.

In FIGS. 3G and 3H, a passivation layer 39 is formed on the TFT "T," on the storage capacitor "C" and on the gate insulation layer 33. The passivation layer 39 is subsequently patterned using a fourth mask to form a drain contact hole 41 to the drain electrode 30 and a capacitor contact hole 43 to the capacitor electrode 16.

In FIGS. 3I and 3J, a transparent conductive material is deposited on the patterned passivation layer 39. The transparent conductive material commonly includes indium tin oxide (ITO) or indium zinc oxide (IZO). Thereafter, the transparent conductive material is patterned to form a pixel electrode 17 in the pixel region "?." A portion of the pixel electrode 17 overlaps the drain electrode 30 and electrically contacts the drain electrode 30 through the drain contact hole 41. Additionally, another portion of the pixel electrode 17 overlaps the portion 13a of the gate line 13 and the capacitor electrode 16, thereby electrically contacting the capacitor electrode 16 through the capacitor contact hole 43.

As described above, the gate insulation layer is commonly formed of a relatively large thickness to prevent any short-circuit between the gate electrode and the drain electrode in the thin film transistor. Thus, the dielectric layer that is the portion of the gate insulation layer also is formed of a relatively large thickness in the storage capacitor. As commonly known, the capacitance of the storage capacitor is inversely proportion to the thickness of the dielectric layer. Accordingly, the storage capacitor fabricated by the above-described fabrication method does not have sufficient capacitance, thereby causing an image-sticking defect when displaying a subsequent image after displaying a previous image.

SUMMARY OF THE INVENTION

Accordingly, the present invention is directed to an array substrate for a liquid crystal display and method for fabricating thereof that substantially obviates one or more of the problems due to limitations and disadvantages of the related art.

An object of the present invention is to provide an array substrate and a method of fabricating thereof for a liquid crystal display device having improved capacitance in a storage capacitor to decrease residual images.

Additional features and advantages of the invention will be set forth in the description that follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an array substrate for a liquid crystal display device includes a substrate, a plurality of thin film transistors formed on the substrate, each thin film transistor includes a gate electrode, a first gate insulation layer, a second gate insulation layer, an active layer, an ohmic contact layer, a source electrode and a drain electrode, a plurality of gate lines, a plurality of data lines disposed orthogonal to the plurality of gate lines, a plurality of pixel electrodes disposed at pixel regions defined by intersections of the plurality of gate lines and the plurality of data lines, each pixel electrode electrically contacting each drain electrode of the plurality of thin film transistors, and a plurality of storage capacitors each including a portion of each gate line as a first capacitor electrode, the first gate insulation layer as a dielectric layer, and a capacitor electrode electrically communicating with each pixel electrode and functioning as a second capacitor electrode with a portion of each pixel electrode.

In another aspect, a method of fabricating a liquid crystal display device includes the steps of forming a first metal layer on a substrate, patterning the first metal layer to form a gate line and a gate electrode, forming a first gate insulation layer and a second gate insulation layer to cover the patterned first metal layer, forming a pure amorphous silicon layer and a doped amorphous silicon layer on the second gate insulation layer, patterning the doped amorphous silicon layer and the pure amorphous silicon layer to expose a portion of the second gate insulation layer and to form an ohmic contact layer and an active layer over the gate electrodes, removing the exposed portion of the second gate insulation layer except a portion under the patterned doped and pure amorphous silicon layers, forming a second metal layer to cover the first gate insulation layer, the second gate insulation layer, the active layer and the ohmic contact layer, patterning the second metal layer to form a data line, a source electrode, a drain electrode and a capacitor electrode, forming a passivation layer to cover the patterned second metal layer, patterning the passivation layer to form a drain contact hole to the drain electrode and a capacitor contact hole to the capacitor electrode, forming a transparent conductive material on the patterned passivation layer, and patterning the transparent conductive material to form a pixel electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are shown in the accompanying drawings. Wherever possible, the same reference numbers will be used throughout the drawings to refer to the same or like parts.

Figure 1:
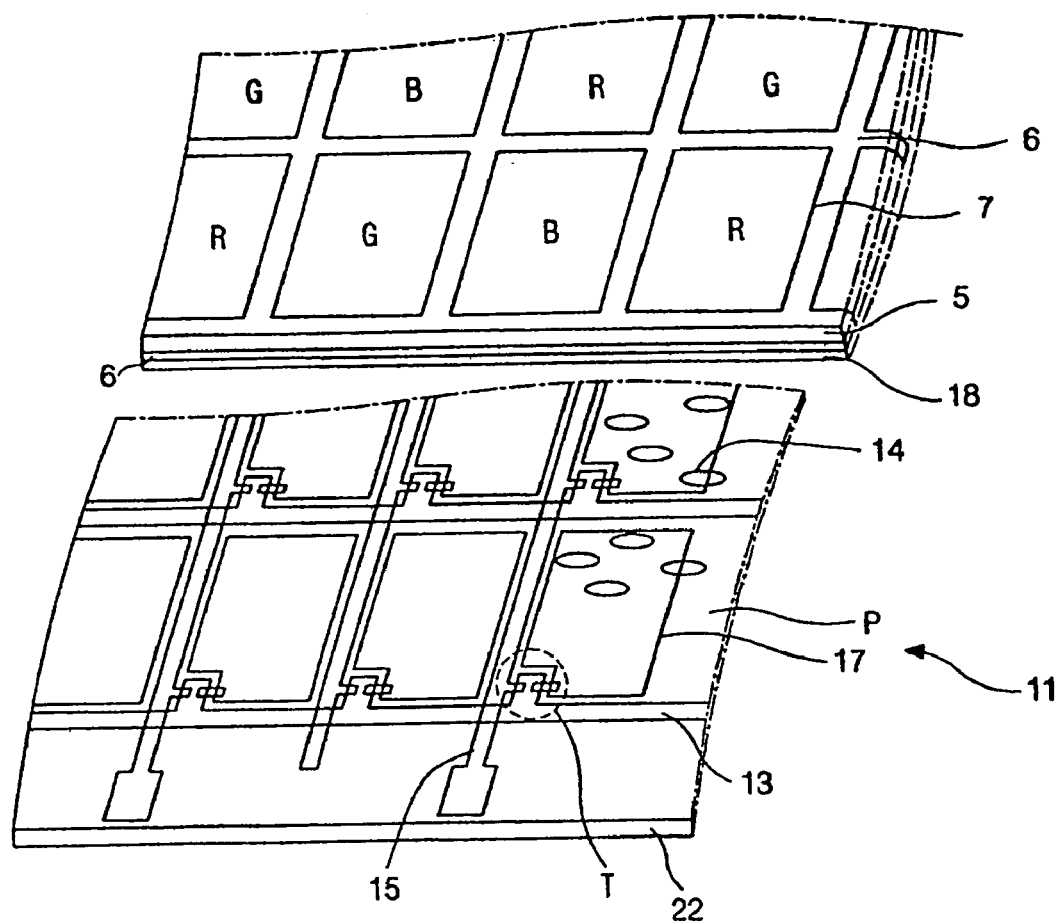
FIG. 1 is the configuration of a conventional LCD device.
Figure 2A:
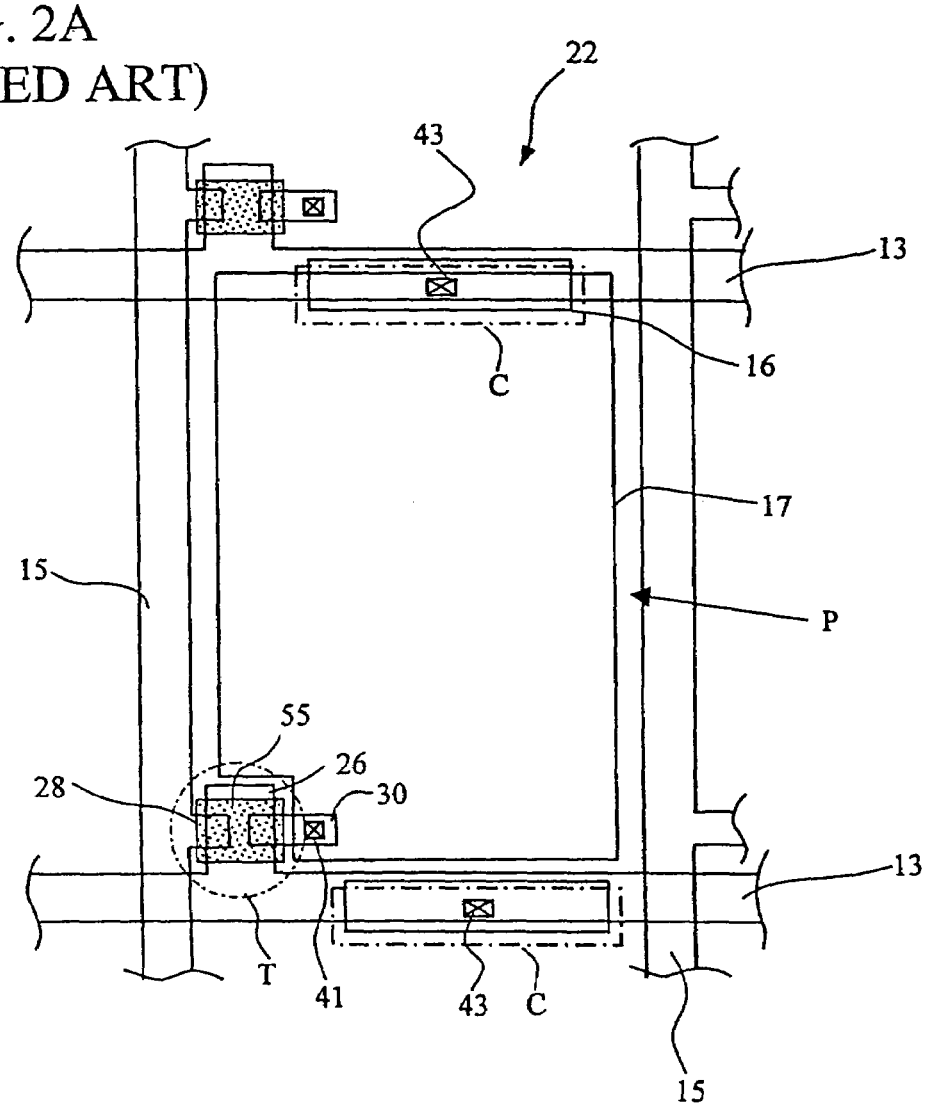
FIG. 2A is a plan view showing a pixel of an array substrate for use in a conventional liquid crystal display device.
Figure 2B:
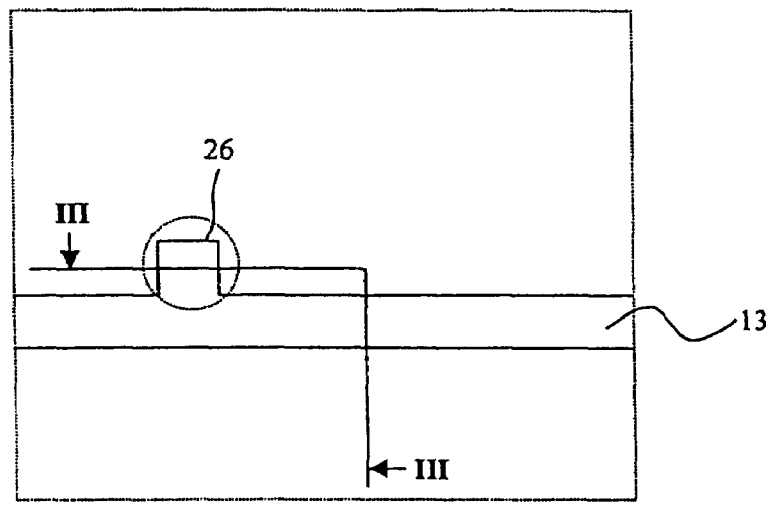
FIG. 2B is a enlarged plan view of the TFT "T" portion of FIG. 2A.
Figure 3A:
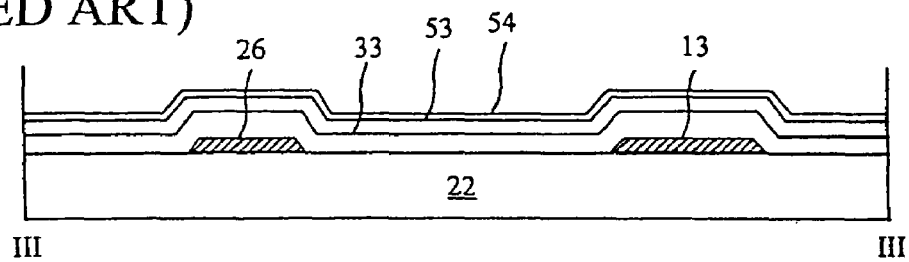
FIGS. 3A to 3J are plan views and cross-sectional views each taken along the line III-III of corresponding plan view and illustrates conventional manufacturing processes of an array substrate of FIG. 2A.
Figure 3B:
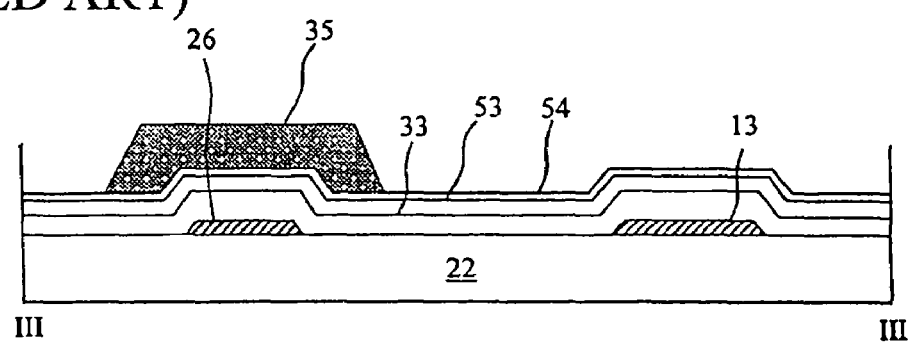
Figure 3C:
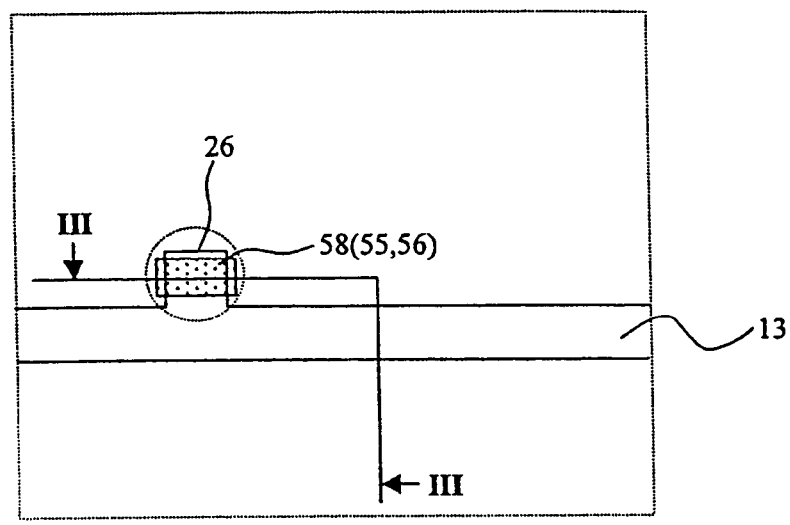
Figure 3D:
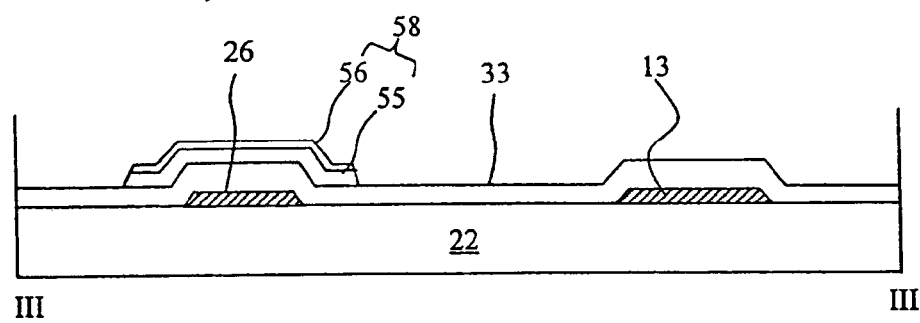
Figure 3E:
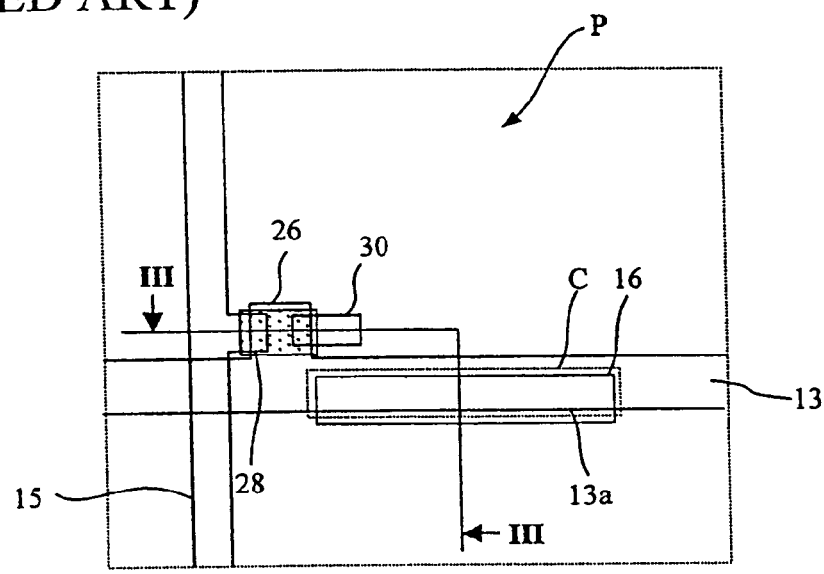
Figure 3F:
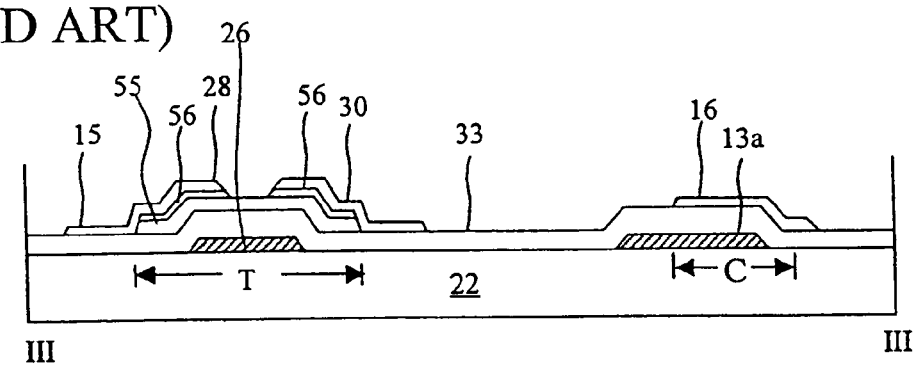
Figure 3G:
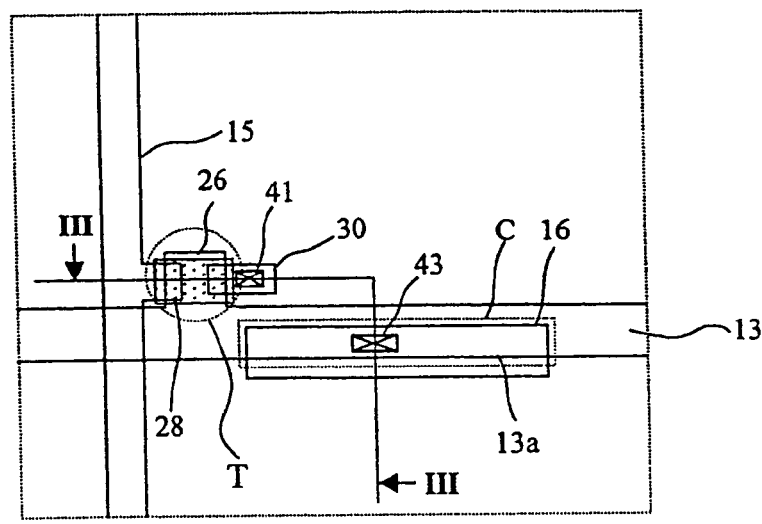
Figure 3H:
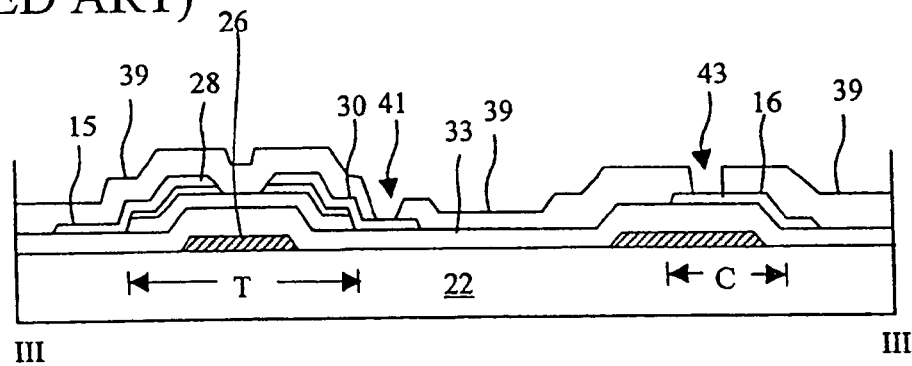
Figure 3I:
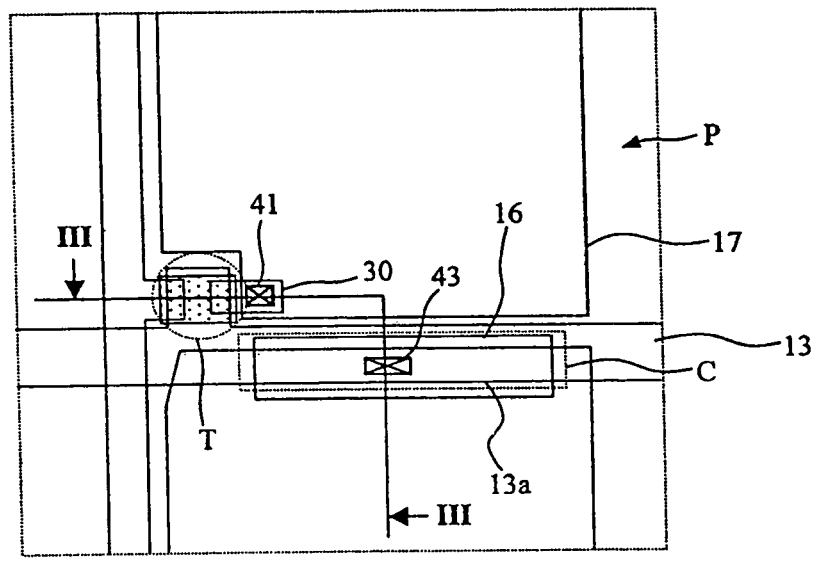
Figure 3J:
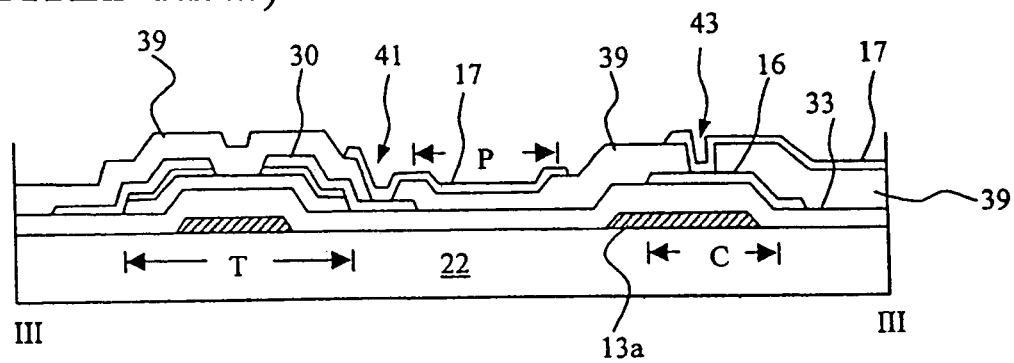
Figure 4A:
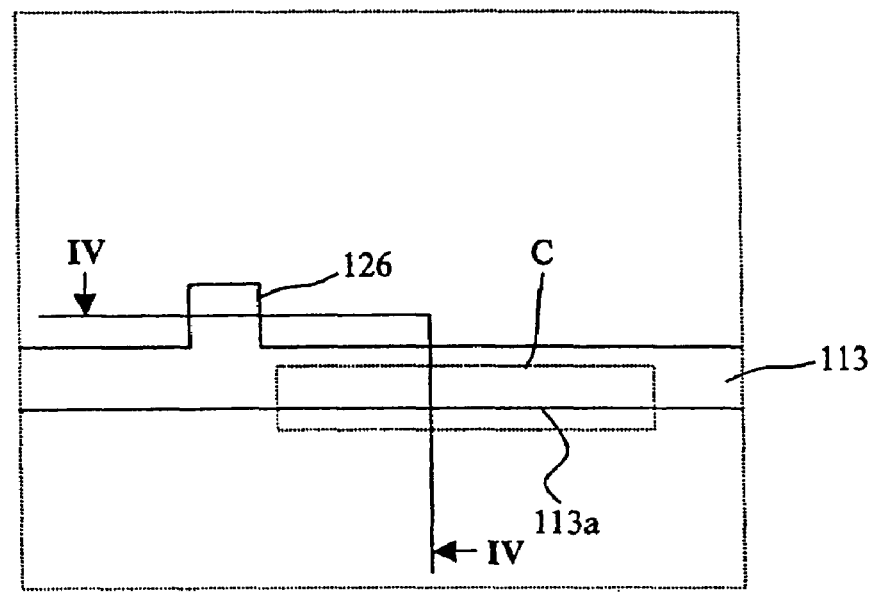
FIGS. 4A to 4K are plan views and cross-sectional views along IV-IV of an exemplary manufacturing process according to the present invention.
Figure 4B:
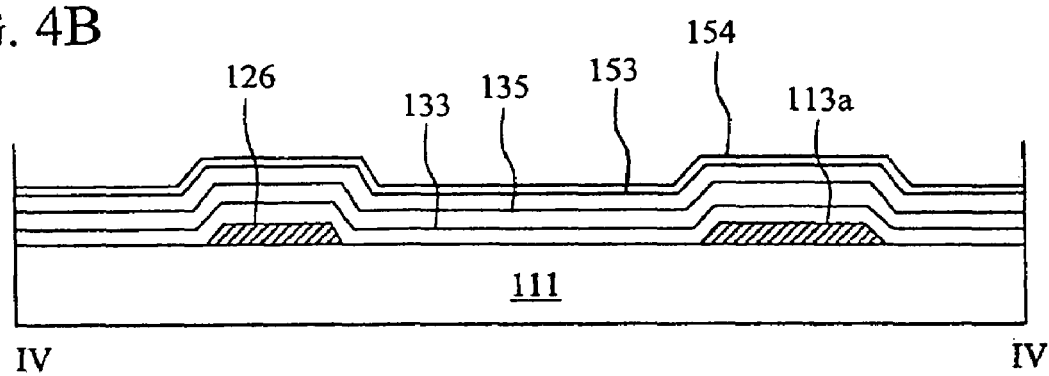

In FIGS. 4A and 4B, a substrate 111 may be cleaned of organic materials and any foreign substances to promote adhesion with a first metal layer that may be subsequently deposited on the substrate 111 by a sputtering process, for example. The first metal layer may be aluminum or aluminum alloy, such as aluminum neodymium (AlNd), for example. The first metal layer is subsequently patterned using a first mask to form gate lines 113 in a transverse direction and a gate electrode 126 that extends from the gate line 113. Alternatively, a double-layered structure may be employed in the gate line 113 and the gate electrode 126. The double-layered structure includes an aluminum (Al) layer stacked with a molybdenum (Mo) layer or a chrome (Cr) layer, for example, that has high corrosion resistance and durability. Furthermore, a portion 113a of the gate line 113 functions as a capacitor electrode.

In FIGS. 4A and 4B, a first gate insulation layer 133 and a second gate insulation layer 135 may be formed on a surface of the substrate 111 to cover the patterned first metal layer. Here, it is important that an etching rate of the first gate insulation layers 133 is different from the etching rate of the second gate insulation layer 135. The first gate insulation layer 133 has a lower etching rate than the second gate insulation layer 135. For example, aluminum oxide ($Al_2O_3$) or silicon oxide ($SiO_x$) may be used as the first gate insulation layer 133, and silicon nitride ($SiN_x$) may be used as the second gate insulation layer 135. After forming the first and second gate insulation layers 133 and 135 on the substrate 111 to cover the patterned first metal layer, a pure amorphous silicon (a-Si:H) layer 153 and a doped amorphous silicon ($n^+$ a-Si:H) layer 154 are sequentally formed upon the second gate insulation layer 135.

Figure 4C:
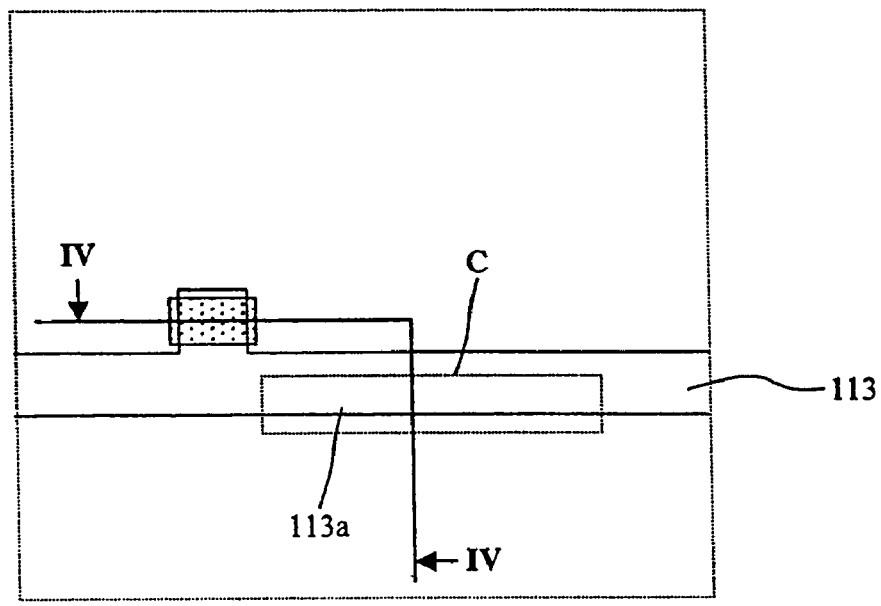
Figure 4D:
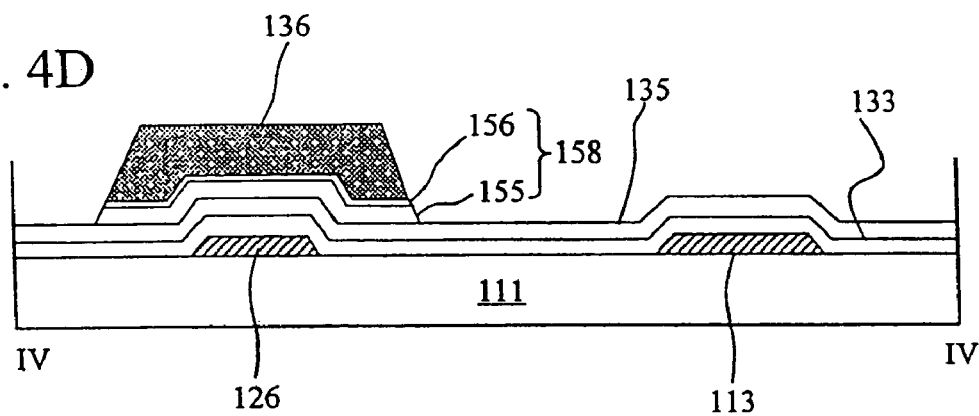
Figure 4E:
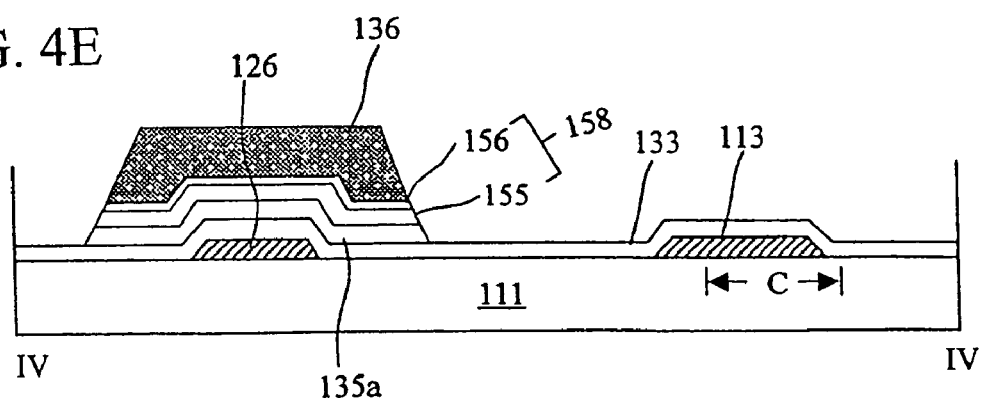

FIGS. 4C-4E show a second mask fabrication process in which the pure amorphous silicon layer 153 and doped amorphous silicon layer 154 may be patterned. A photo resist may be formed on the doped amorphous silicon layer 154 and then exposed to light using an additional mask (not shown). Thereafter, the photo resist may be developed to form a patterned photo resist 136 over the gate electrode 126 and to expose the doped amorphous silicon layer. The exposed portion of the doped amorphous silicon layer 154 and a portion of the pure amorphous silicon layer 153 may then be removed, thereby forming an active layer 155 and an ohmic contact layer 156 over the gate electrode 126. Accordingly, a semiconductor layer 158 including the active layer 155 and ohmic contact layer 156 may be formed on the second gate insulation layer 135 disposed over the gate electrode 126. As a result of this process, the second gate insulation layer 135 may be exposed except for a portion over the gate electrode 136.

In FIG. 4E, the exposed portions of the second gate insulation layer 135 may be removed using the patterned photo resist 136 as a mask, and a patterned second gate insulation layer 135a may be formed over the gate electrode 126. The first gate insulation layer 133 and the patterned second gate insulation layer 135a may be stacked on the gate electrode 126, while only the first gate insulation layer 133 may be disposed on the gate line 113 to function as a capacitor electrode.

Figure 4F:
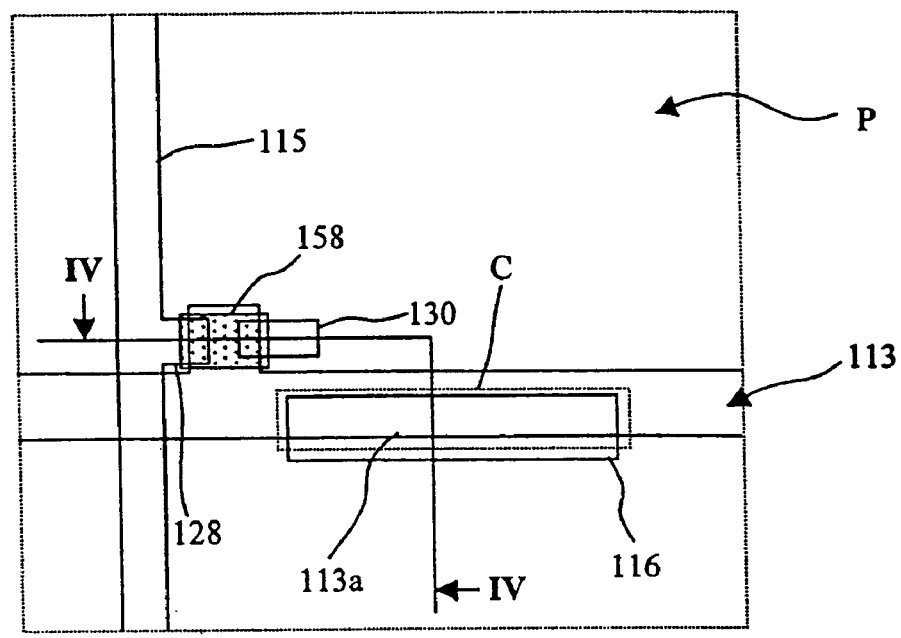
Figure 4G:
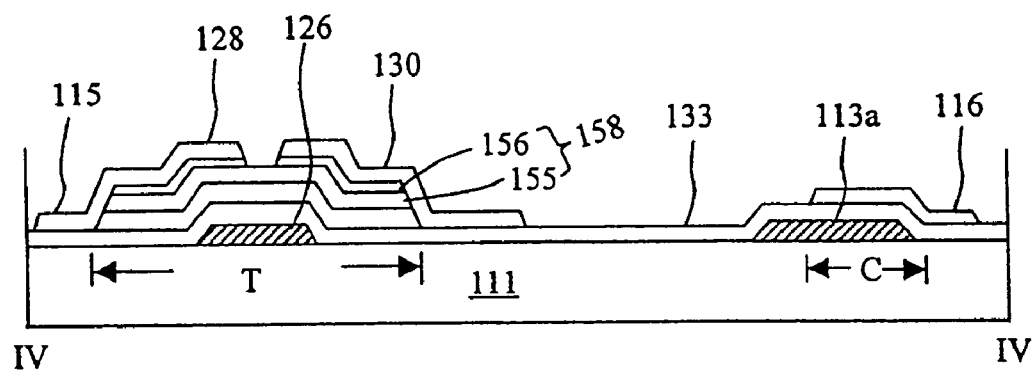

In FIGS. 4F and 4G, after removing the patterned photo resist 136 of FIG. 4D, a second metal layer may be formed upon the ohmic contact layer 156 and first gate insulation layer 133 by depositing a metallic material, such as molybdenum (Mo), chrome (Cr), tungsten (W), aluminum (Al), aluminum alloy or an alloy thereof, for example. The second metal layer may be subsequently patterned using a third mask to form a source electrode 128 and a drain electrode 130. Furthermore, a data line 115 and a capacitor electrode 116 may be formed along with the formation of the source electrode 128 and the drain electrode 130. The data line 115 may be arranged perpendicular to the gate line 113 to define a pixel region "P" with a data line 115. The source electrode 128 may extend from the data line 115, and the drain electrode 130 may be space apart from the source electrode 128. The source electrode 128 and the drain electrode 130 may overlap opposite end portions of the gate electrode 126, respectively. Thus, a thin film transistor (TFT) "T" may be formed. Moreover, the capacitor electrode 116 may be disposed over a portion 113a of the gate line 113. Accordingly, a storage capacitor "C" may comprise the portion 113a of the gate line 113 as a first capacitor electrode, a portion of gate insulation layer 133 as a dielectric layer, and the capacitor electrode 116 as a second capacitor electrode.

If the second metal layer is formed of aluminum in the above-mentioned structure, molybdenum (Mo) or chrome (Cr) is disposed on the second metal layer in order to form a double-layered structure.

Still referring to FIG. 4G, a portion of the ohmic contact layer 156 disposed upon the active layer 155 is etched using the source electrode 128 and drain electrode 130 as masks, thereby forming a channel region in the active layer 155 between the source electrode 128 and the drain electrode 130.

Figure 4H:
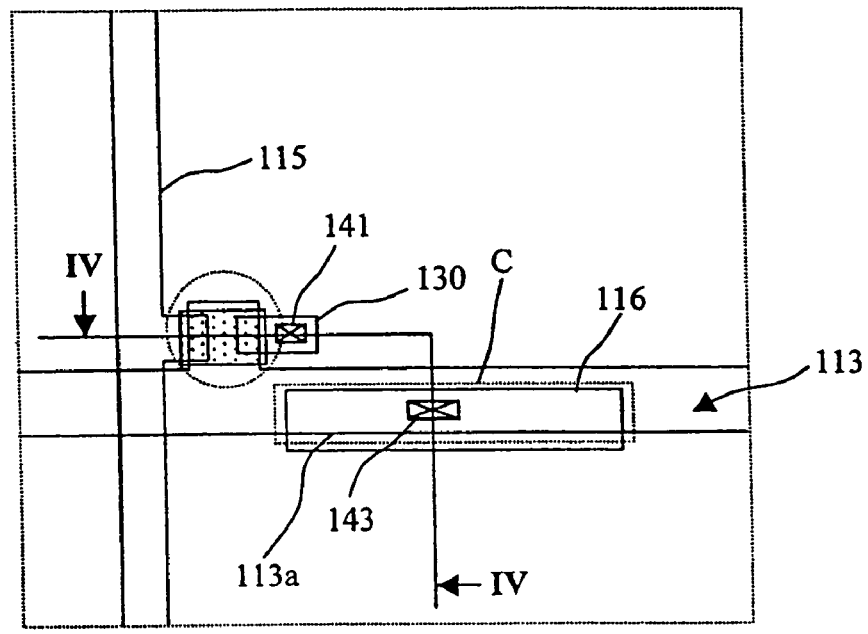
Figure 4I:
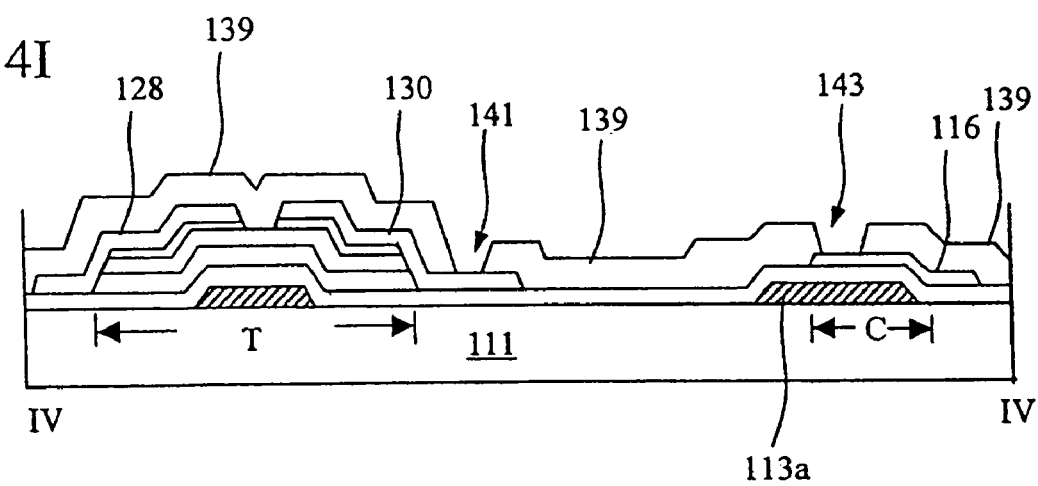

Now, referring to FIGS. 4H and 4I, a passivation layer 139 is formed on the TFT "T", on the storage capacitor "C" and on the first gate insulation layer 133. Thereafter, the passivation layer 139 is patterned using a fourth mask to form a drain contact hole 141 to the drain electrode 130 and a capacitor contact hole 143 to the capacitor electrode 116.

Figure 4J:
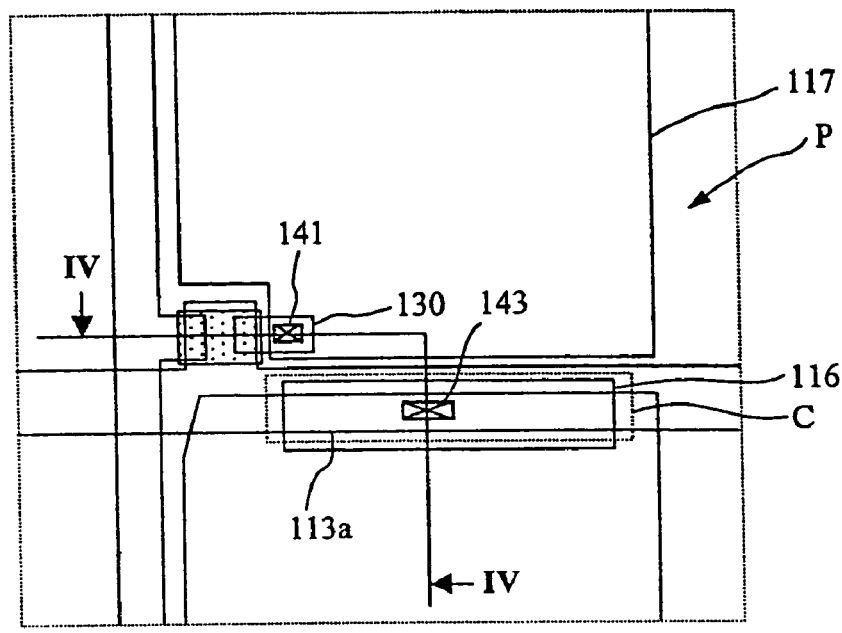
Figure 4K:
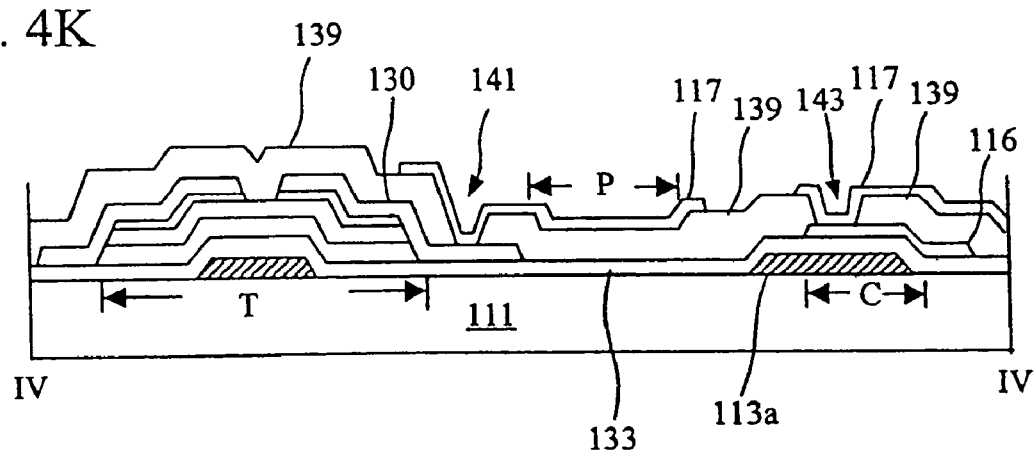

In FIGS. 4J and 4K, a transparent conductive material is deposited on the patterned passivation layer 139. The transparent conductive material usually includes indium tin oxide (ITO) or indium zinc oxide (IZO). Thereafter, the transparent conductive material is patterned to form a pixel electrode 117 in the pixel region "P". A portion of the pixel electrode 117 overlaps a portion of the drain electrode 130 and electrically contacts the drain electrode 130 through the drain contact hole 141. Additionally, another portion of the pixel electrode 117 overlaps the portion 113a of the gate line 113 and the capacitor electrode 116, thereby electrically contacting the capacitor electrode 116 through the capacitor contact hole 143. The portion 113a of the gate electrode 113 functions as a first capacitor electrode in the storage capacitor "C", the first gate insulation layer 133 functions as a dielectric layer, and the capacitor electrode 116 and pixel electrode 117 altogether function as a second capacitor electrode in the storage capacitor electrode "C".

Accordingly, the first and second gate insulation layers are arranged between the gate electrode and the drain electrode in the TFT, while only the first gate insulation layer is arranged between the first capacitor electrode and second capacitor electrode in the storage capacitor. As mentioned, since two insulators are formed on the gate electrode without any additional mask process, the short between the gate electrode and the drain electrode is prevented. Further, since one insulator is formed on the gate line as a dielectric layer, the capacitance of the storage capacitor increases. Therefore, this inventive configuration and structure prevent the residual images from occurring in the liquid crystal display devices, thereby increasing a manufacturing yield.

It will be apparent to those skilled in the art that various modifications and variations can be made in the capacitor and the manufacturing method thereof of the present invention without departing from the spirit or scope of the inventions. Thus, it is intended that the present invention cover the modifications and variations of this invention provided they come within the scope of the appended claims and their equivalents.

What is claimed is:

1. A method of fabricating an array substrate for a liquid crystal display device, comprising the steps of:

forming a first metal layer on a substrate;

patterning the first metal layer to form a gate line and a gate electrode;

forming a first gate insulation layer and a second gate insulation layer to cover the patterned first metal layer;

forming a pure amorphous silicon layer and a doped amorphous silicon layer on the second gate insulation layer;

patterning the doped amorphous silicon layer and the pure amorphous silicon layer to expose a portion of the second gate insulation layer and to form an ohmic contact layer and an active layer over the gate electrodes;

removing the exposed portion of the second gate insulation layer including a portion overlapping a first portion of the gate line, to form a patterned portion of the second gate insulating layer under the patterned doped and pure amorphous silicon layers such that the first gate insulating layer is exposed;

forming a second metal layer to cover the first gate insulation layer, the second gate insulation layer, the active layer and the ohmic contact layer;

patterning the second metal layer to form a data line, a source electrode, a drain electrode and a capacitor electrode, the capacitor electrode directly on the exposed first gate insulation layer and overlapping the first portion of the gate line;

forming a passivation layer to cover the patterned second metal layer;

patterning the passivation layer to form a drain contact hole to the drain electrode and a capacitor contact hole to the capacitor electrode;

forming a transparent conductive material on the patterned passivation layer; and patterning the transparent conductive material to form a pixel electrode.

2. The method of fabricating an array substrate according to claim 1, wherein the first gate insulation layer includes at least aluminum oxide ($Al_2O_3$).

3. The method of fabricating an array substrate according to claim 1, wherein the first gate insulation layer includes at least silicon oxide ($SiO_x$).

4. The method of fabricating an array substrate according to claim 1, wherein the second gate insulation layer includes at least silicon nitride ($SiN_x$).

5. The method of fabricating an array substrate according to claim 1, wherein the pixel electrode is formed of a transparent conductive material selected from a group consisting of indium tin oxide and indium zinc oxide.

6. The method of fabricating an array substrate according to claim 1, wherein the pixel electrode is connected with the drain electrode through the drain contact hole and is located in a pixel region defined by the gate line and the data line.

7. The method of fabricating an array substrate according to claim 1, wherein the pixel electrode is connected with the capacitor electrode through the capacitor contact hole.

* * * * *